US005636129A

United States Patent [19]
Her

[11] Patent Number: 5,636,129
[45] Date of Patent: Jun. 3, 1997

[54] ELECTRICAL ROUTING THROUGH FIXED SIZED MODULE AND VARIABLE SIZED CHANNEL GRIDS

[76] Inventor: One-Hsiow A. Her, 6785 Mason Way, San Jose, Calif. 95129

[21] Appl. No.: 230,067

[22] Filed: Apr. 20, 1994

[51] Int. Cl.$^6$ ..................................................... G06F 17/50
[52] U.S. Cl. ......................... 364/488; 364/489; 364/491
[58] Field of Search ..................................... 364/488–491

[56] References Cited

U.S. PATENT DOCUMENTS

| | | | |
|---|---|---|---|
| 4,484,292 | 11/1984 | Hong et al. | 364/491 |
| 4,777,606 | 10/1988 | Fournier | 364/491 |
| 5,198,987 | 3/1993 | Shindo et al. | 364/490 |
| 5,224,057 | 6/1993 | Igarashi et al. | 364/490 |
| 5,245,550 | 9/1993 | Miki et al. | 364/490 |
| 5,258,920 | 11/1993 | Haller et al. | 364/490 |
| 5,375,069 | 12/1994 | Satoh et al. | 364/490 |
| 5,402,359 | 3/1995 | Oyanagi | 364/491 |
| 5,416,720 | 5/1995 | Fukui | 364/489 |
| 5,420,800 | 5/1995 | Fukui | 364/491 |

OTHER PUBLICATIONS

Li et al., "Global Refinement for Building Block Layout", 1989 Int'l Computer–Aided Design Conference, pp. 90–93.

Ng, "A Gridless Variable–Width Channel Router for Macro Cell Design," 24th ACM/IEEE Design Automation Conference, pp. 633–636.

Xiong, "Two–Dimensional Compaction for Placement Refinement," 1989 Int'l Computer–Aided Design Conference, pp. 136–139.

H. B. Bakoglu, *Circuits, Interconnections, and Packaging for VLSI*, Addison–Wesley Publishing Company, Chap. 1, "Introduction," pp. 1–2.

Toshihiko Tada and Akihiko Hanafusa, "Router System for Printed Wiring Boards of Very High–Speed, Very Large–Scale Computers," 23rd Design Automation Conference, 1986, pp. 791–797.

Michael Burstein and Mary N. Youssef, "Timing Influenced Layout Design," 22nd Design Automation Conference, 1985, pp. 124–130.

Wei–Ming Dai, Masao Sato, and Ernest S. Kuh, "A Dynamic and Efficient Representation of Building–Block Layout," 24th ACM/IEEE Design Automation Conference, 1987, pp. 376–384.

Dahe Chen and Carl Sechen, "Mickey: A Macro Cell Global Router," European DAC, 1991. No Page #5.

Benjamin S. Ting and Bou Nin Tien, "Routing Techniques for Gate Array," *IEEE Transactions on Computer–Aided Design*, vol. CAD–2, No. 4, Oct. 1983, pp. 301–312.

M. Igusa, Y. Nishizaki, and A. Sangiovanni–Vincentelli, "Mercury: A New Approach to Macro–cell Global Routing," *U. C. Berkeley Internal Report*, 1991, pp. 1–23.

*Primary Examiner*—Kevin J. Teska
*Assistant Examiner*—Leigh Marie Garbowski
*Attorney, Agent, or Firm*—Oblon, Spivak, McClelland, Maier & Neustadt, P.C.

[57] ABSTRACT

A method for determining global electrical connection paths between connection pins distributed at predetermined locations on substantially rectangular electrical modules located in non-overlapping orientations on the surface of a semiconductor chip with predetermined channels between adjacent ones of the modules, includes dividing the modules into rectangular grid cells of predetermined dimensions and the predetermined channels into additional grid cells including rectangular channel regions having prespecified dimension ranges and sharing boundary segments with adjacent module derived grid cells. The routing method includes restricting routing to not more than a single boundary segment between a module grid cells and adjacent channel grid cells, and between a channel grid cell and adjacent module grid cells.

15 Claims, 6 Drawing Sheets

ELECTRICAL ROUTING THROUGH FIXED SIZED MODULE AND VARIABLE SIZED CHANNEL GRIDS

TECHNICAL FIELD

This invention relates to automated design methods, and particularly to methods for automated design in the field of integrated circuits.

BACKGROUND OF THE INVENTION

Prior art products in the field of channel-based global routers are known which utilize global routing graphs for routing electric connection lines between circuit modules and pins during semiconductor chip development. Fixed area-based global routers have been employed for establishing electrical connection schemes between source and target pins in fixed die designs. In the case of area-based global routers, regular sized global routing grids are employed. The major difference between kinds of routers which are employed in the prior art is whether the size of the routing region is variable or not.

A recent approach to routing is to use blocks or cells from a library containing reusable designs. Routing with such blocks and cells is made complicated, because the blocks and cells have standard sizes which are conventionally routed according to a fixed area routing approach, while the variable sized channels may conventionally be routed by another kind of router approach. In lieu of actually performing full fixed area routing over the blocks and cells, preprocessing can be done for the over the block routing. However, the result of this is that the number of pins per net are increased. Further, an increased level of computing complexities is employed and additionally the effect of this two step approach is that the quality of the routing itself is diminished.

It is accordingly desirable to perform routing in a manner which limits the total number of pins in a particular circuit interconnection scheme. It is further desirable to provide a fundamental solution in the nature of a generic global routing approach effective for accomplishing routing in one single step which can handle both fixed-sized area and variable-sized channel routing in one process.

SUMMARY OF THE INVENTION

The invention herein is accordingly directed toward methods for establishing an electrical circuit connection between connector pins in electric circuit modules. The modules contain predetermined patterns of electric components and interconnections terminating at selected points in the module or on its surface. For convenience in routing the precise connection paths between particular module pins, the modules are divided up in a grid pattern containing rectangular cells. These rectangular cells may be square shaped, and the module cells are called module grid cells. A particular module grid cell may contain a plurality of pins at particular locations. In order to enable routing of electric lines to connect particular pin combinations, the modules are separated on a semiconductor cell by channels. The widths of these channels may be typically less than the side dimensions of the module grid cells. For convenience in determining connection paths through the channels, the channels themselves are divided up into rectangular regions called channel grid cells, which share boundaries with adjacent modules. A module grid cell may share a common boundary with several channel grid cells, or a channel grid cell may share a common boundary with several module grid cells. Accordingly, the boundary can be said to be divided up into several boundary segments. To enable determination of circuit connection routing paths according to the invention, all of the connections between a particular module grid cell and adjacent channel grid cells are constrained to pass through a selected one or ones of the boundary segments on a particular side of the module grid cell. Then, first and second pins are selected to establish a first connection path for pins in modules to be connected. One of the respective grid cells in which the first and second pins are located is designated the source cell for the initial routing determination and the other is designated the target cell. Next, grid cell wavefronts are established, the first surrounding the source cell, and subsequent wavefronts successively surrounding earlier wavefronts and the source cell, until a final wavefront touches the target cell. Cost values are associated with the grid cells in each wavefront to guide the routing through the successive wavefronts on the path to the target cell. A connection route between the first and second pins is accordingly established in view of the cost factors. Next, the routine is repeated by the selection of a next set of source and target pins and grids, which now incorporate cost values to take into account the prior connection path just established between the earlier set of first and second pins.

The invention herein in accordingly directed toward methods and arrangements effective for accomplishing routing in a process which accomplishes routing over both step cells and through channels in a single unitary process according to the invention. The present invention thus uses a maze router process for global routing over channels of variable size as well as over steps and cells which have a fixed size area.

Figures 1A, 1B:
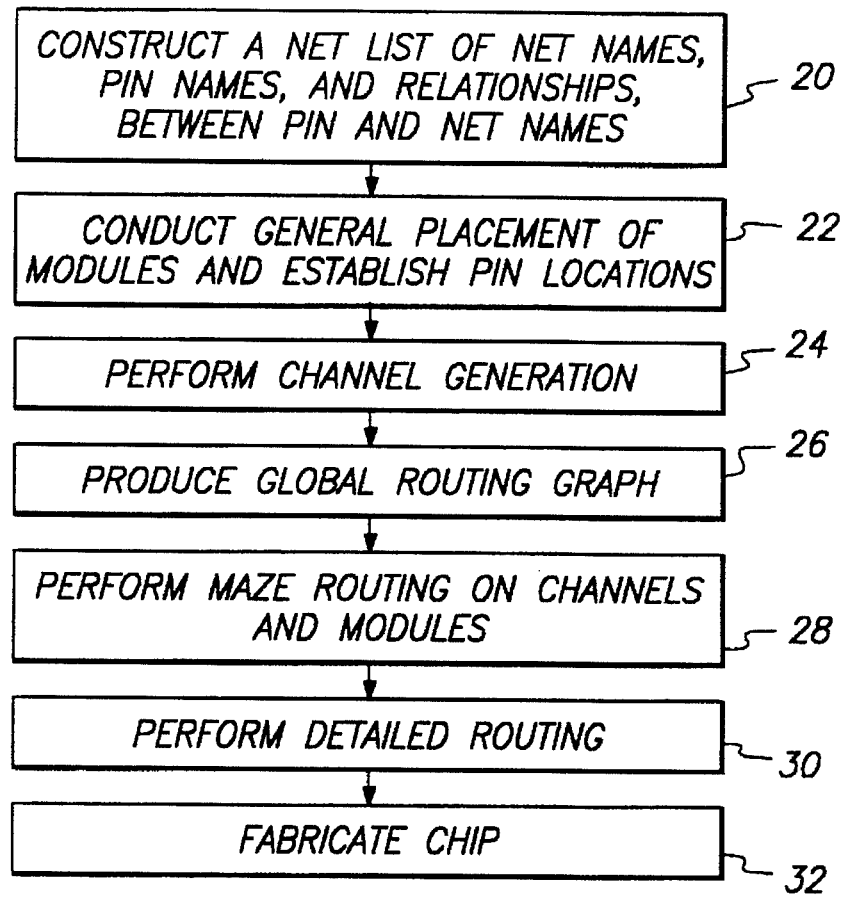
FIG. 1a is a flow chart of the basic design process according to the present invention for constructing a semiconductor chip including specification of the placement of chip blocks and modules and the routing of electrical connections between pins and terminals of circuit modules on the chip.
Figure 1C:
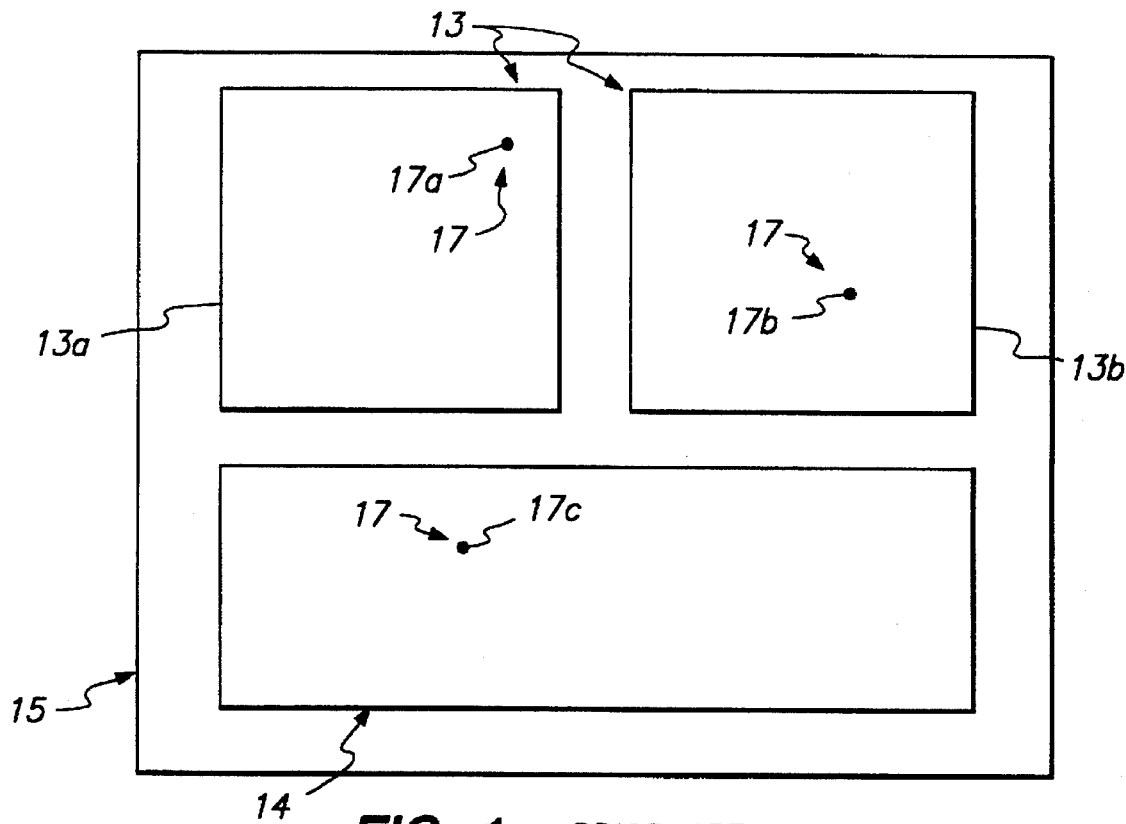
Figure 1D:
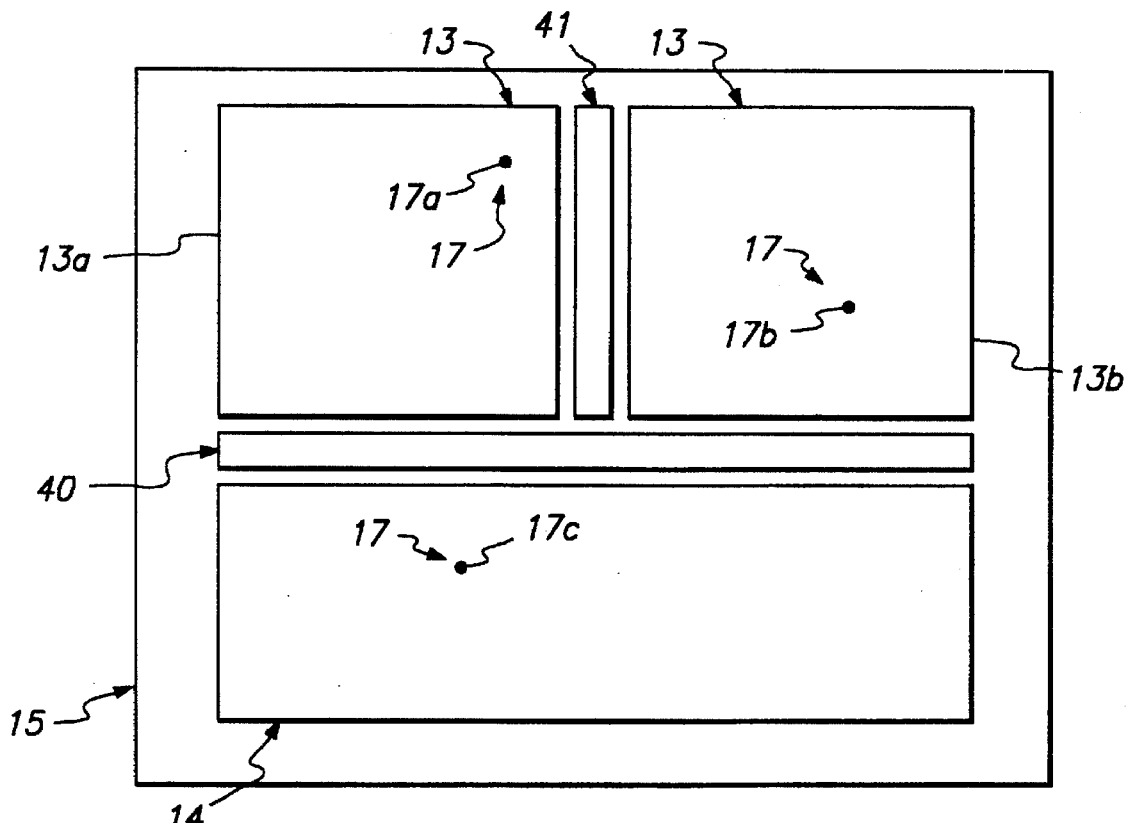
Figure 1E:
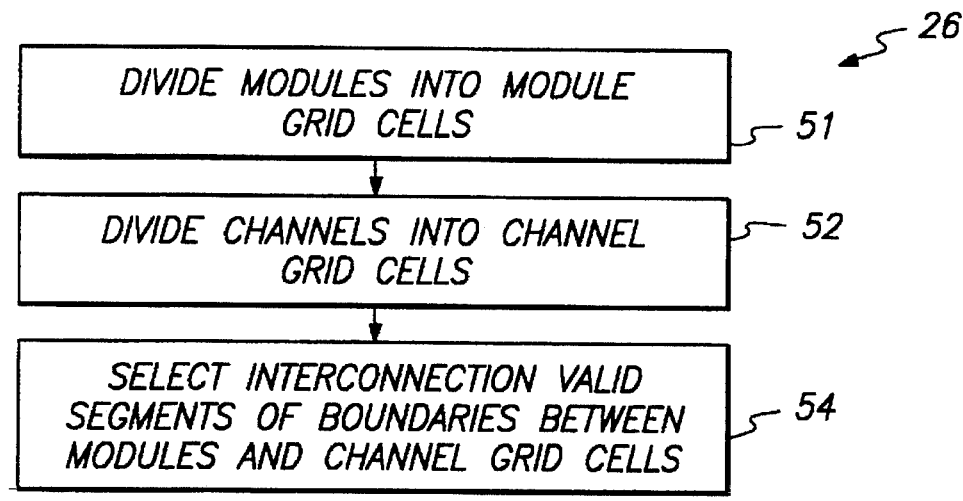
Figure 1F:
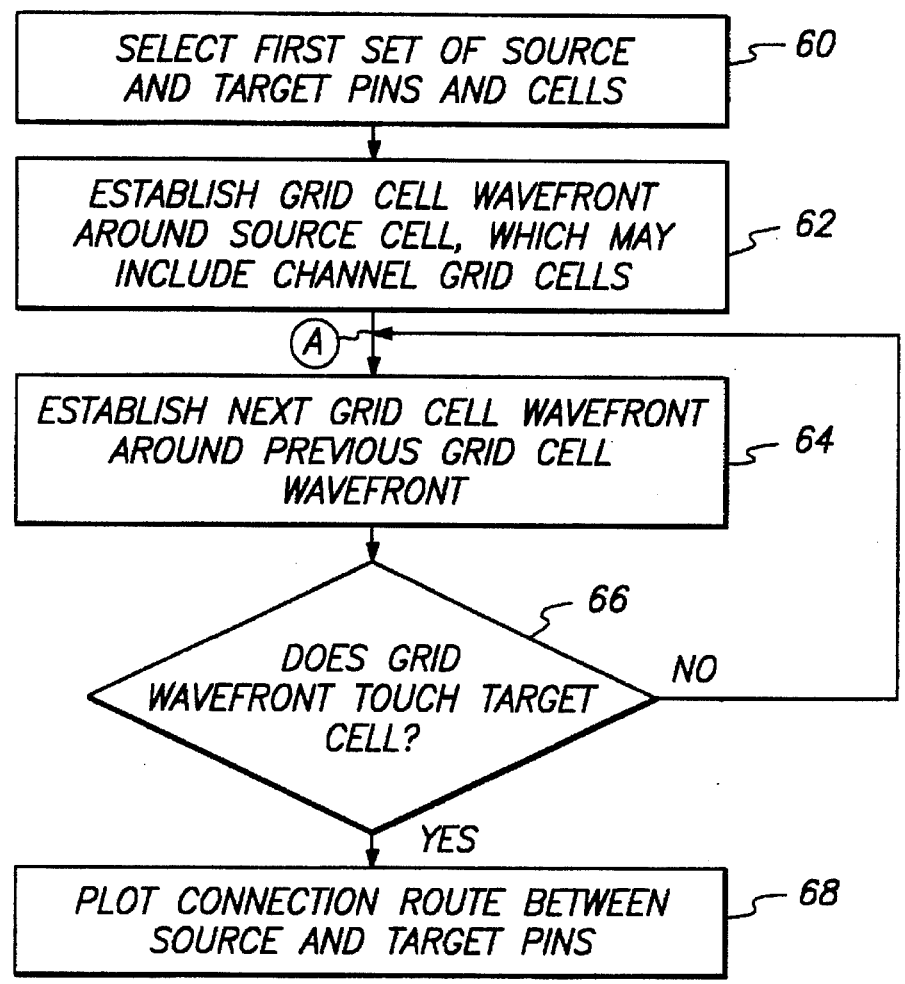
Figure 1G:
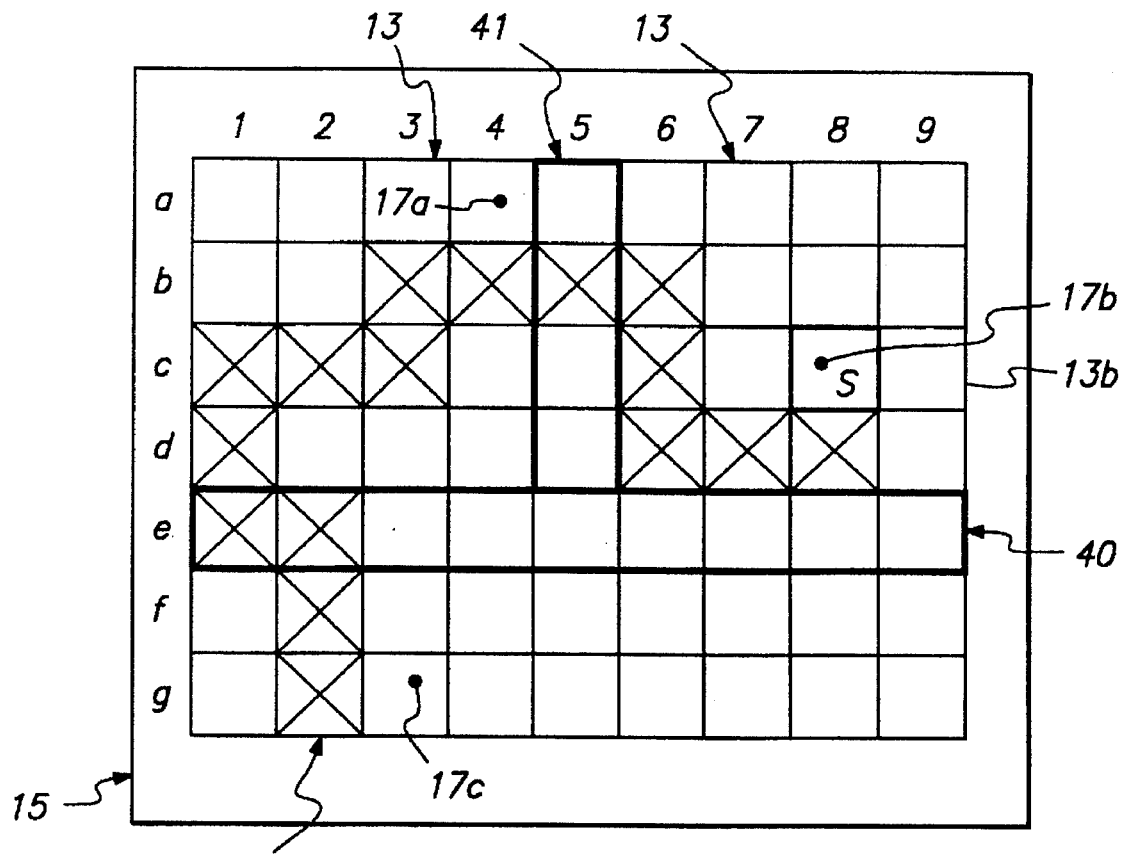
Figure 2:
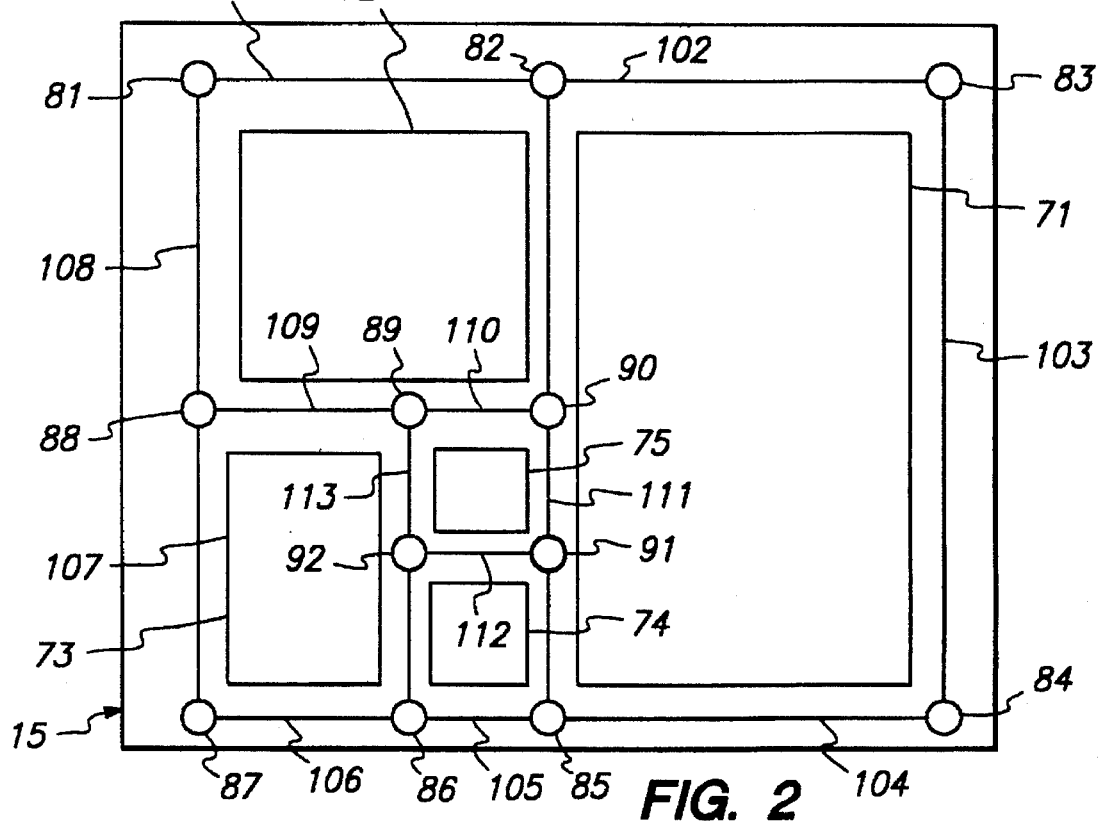
Figure 3:
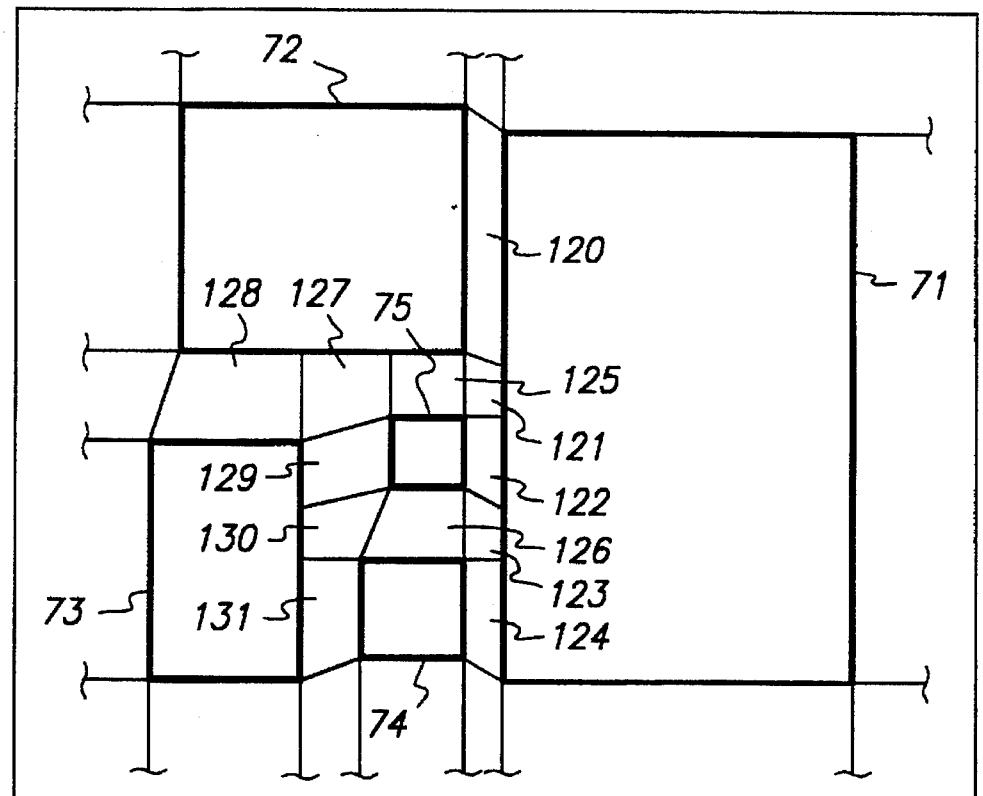
Figure 4:
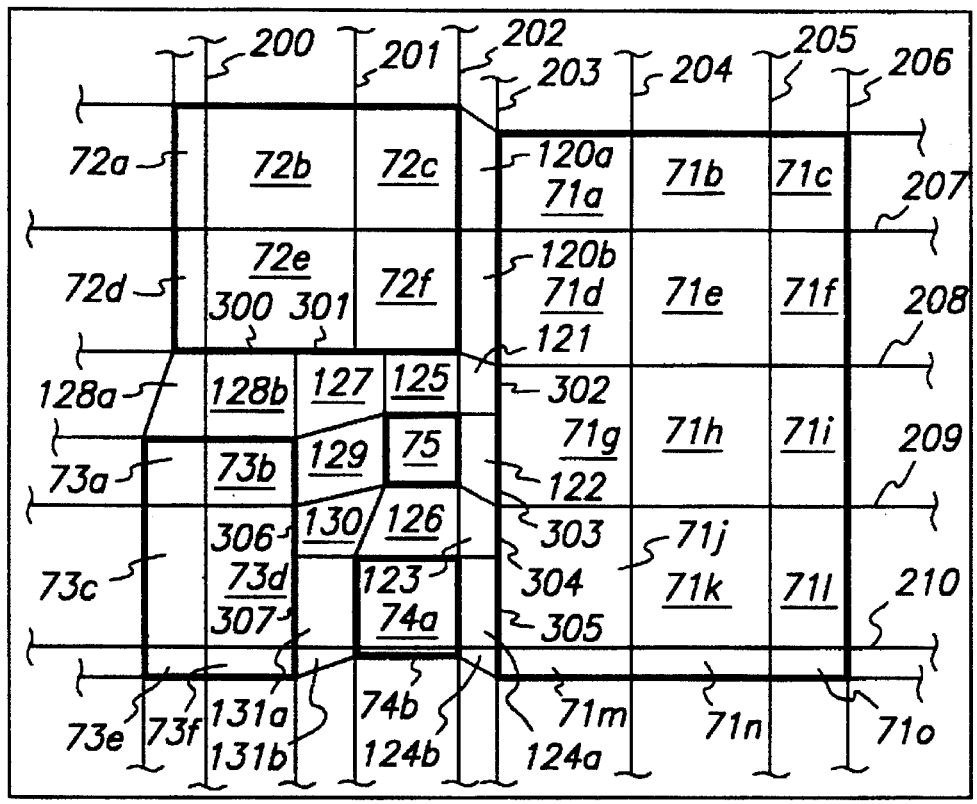
Figure 5:
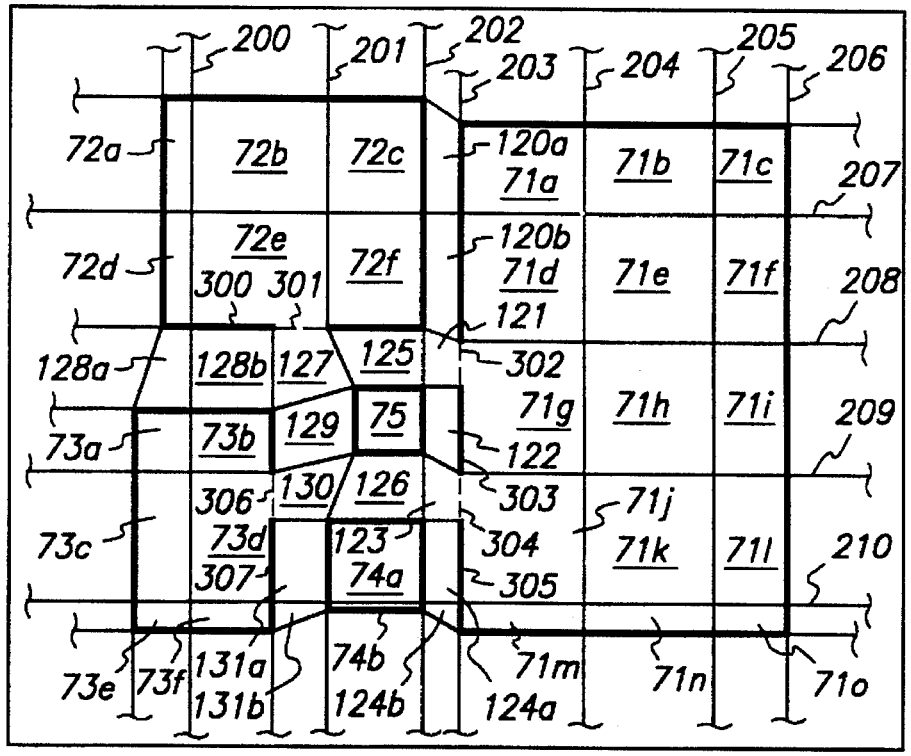
Figure 6:
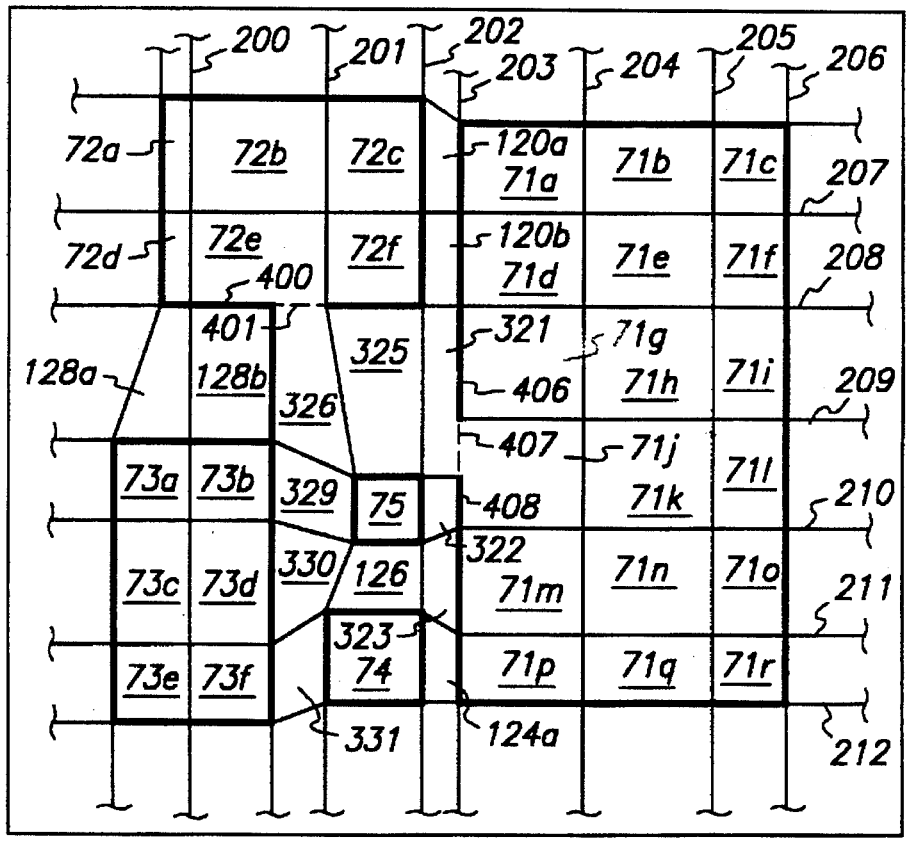

FIG.. 1b is a table which illustrates a basic electric circuit representation according to the prior art, which is to be converted into a physical semiconductor chip layout diagram in accordance with the present invention;

FIG. 1c is a diagram of electric circuit modules which have been subject to prior art placement operation on a semiconductor substrate plot with the specific pin locations established within the substrate plot reference frame;

FIG. 1d is a diagram of the electric circuit modules of FIG. 1c, which illustrates the process of channel generation, as is well-known under the prior art;

FIG. 1e is a flow chart of steps in accordance with the present invention directed toward production of a global routing graph;

FIG. 1f is a flow chart of steps in accordance with the invention herein directed toward performance of maze routing on channels and modules;

FIG. 1g is a diagram of an example of a grid cell routing pattern under the present invention;

FIG. 2 shows global routing graph of the design which is selected for implementation;

FIG. 3 shows a warp grid derived from the global routing graph of FIG. 2 based on each node and edge of the global routing graph becoming a basic element and each cell boundary becoming a warp grid on the boundary of each step cell row;

FIG. 4 illustrates the laying down of a regular sized global routing grid over the warp grid of FIG. 3;

FIG. 5 illustrates the warp grid with the regular size global routing grid of FIG. 4 additionally having shaded segments shown on cell boundaries without connections between two neighboring cells; and FIG. 6 illustrates a warp grid version similar to that shown in FIG. 5, but having some of the modules of FIG. 5 shifted downward to create channels of greater width and channel grid cells greater than some module grid cells.

DETAILED DESCRIPTION OF THE PREFERRED EMBODIMENTS

FIG. 1a is a flow chart of the basic design process according to the present invention for constructing a semiconductor chip using a general purpose computer including specification of the placement of chip steps and modules and the routing of electrical connections between pins and terminals of circuit modules on the chip. The general purpose computer may, for example, be a workstation manufactured by Sun Microsystems, Hewlett-Packard Company, DEC, or IBM. For purposes herein, chip blocks will be referred to as modules. As will be discussed in greater detail below with reference to FIG. 1c which shows electric circuit modules 13 on a semiconductor chip 15, the modules 13 contain predetermined patterns of electric circuitry, which may be custom circuits, semicustom circuits, or standard circuits or cells from a predetermined library. Each module 13 has at least a single terminal or pin 17 for enabling the module 13 with which the pin is associated to be electrically connected to another module.

The steps of producing a semiconductor chip 15 include construction of a net list in a form, for example, as illustrated at step 20 in FIG. 1a. Further, the design process includes conducting general placement of modules 13 and the establishment of pin locations according to step 22. The process additionally includes performing channel generation as per step 24, producing a global routing graph per step 26, performing maze routing on modules 13 and channels between modules 13 according to step 28, performing detailed routing per step 30, and actual fabrication of the semiconductor chip as per step 32.

FIG. 1b is a table which illustrates a portion of a basic electric circuit net list representation of semiconductor chip 15 according to the prior art. The net list is converted into a physical semiconductor chip in accordance with the present invention as will be discussed in greater detail below. The net list includes the names, types, and relationship of particular features of the semiconductor chip design being developed. These features include the wires or "nets", which connect pins in modules on semiconductor chip. The term "net" is a term used to represent the single wires or network of wires used to connect pins in modules of a semiconductor chip. Typically, a net connects two pins. However, nets may also connect larger numbers of pins, as is the case of nets which connect three, four, five, or more pins. Pins typically have names which can be selected from combinations of numbers, letters, and other characters. For example in FIG. 1b, two pins are suggested and their names are respectively "BLACK" and "BLUE." Further, a single net is specified, that is "net A." Finally, two modules, respectively named MANDY and NANCY, are indicated. Module MANDY is indicated as having a relationship with pin BLACK. Further, module NANCY is indicated as having a relationship with pin BLUE. A module can have pins as electrical connection terminals, and this is the relationship between the indicated pins and modules.

FIG. 1c is a diagram of electric circuit modules 13 and 14. Modules 13 include similar-sized first and second modules 13a and 13b. Modules 13 and 14 are shown placed in accordance with conventional operation on the substrate plot of a semiconductor chip 15 with the specific pin locations established within the substrate plot reference frame for pins 17. FIG. 1d is a diagram of the electric circuit modules 13 and 14 of FIG. 1c, which illustrates the conventional process of channel generation. In particular, channel generation includes defining the territory and dimensions of particular channels 40 and 41 between modules 14 and modules 13a and 13b, and between modules 13a and 13b respectively, on semiconductor chip 15. For example, horizontal channel 40 extends almost the entire width of semiconductor chip 15. Further, vertical channel 41 extends only from the center of semiconductor chip 15 to a region near the top of the chip. These conventional design steps may be performed in channel generation step 24 of FIG. 1a.

FIG. 1e is a flow chart of the process according to the present invention for producing a cellularized global routing graph as is set forth by way of example in FIG. 5. A global routing graph is a basic diagram showing the placement of general circuit elements including modules on the surface of the semiconductor chip being designed. FIG. 2, as will be discussed, illustrates the global routing graph with a node interconnection diagram superimposed thereover in accordance with one version of the method of the present invention. The steps set forth in respective steps 51, 52, and 54 of FIG. 1e illustrate features of the invention including the division of the circuit modules 13 into module grid cells (step 51). FIG. 4 shows details of the layout resulting from the process including the superimposition of a grid of predetermined step spacing, as discussed herein. Step 52 includes dividing the channels 40 between modules 13 into channel grid cells which share boundaries with adjacent module grid cells. Finally, step 54 selects boundary segments between channel grid cells and module grid cells such that actual interconnections according the technique of maze routing are exclusively executed only through interconnection valid segments of the shared boundary between channel and module grid cells.

FIG. 1f is a flow chart of steps in accordance with the invention herein for maze routing on channels and modules as part of an integrated process. Maze routing conventionally begins with the selection of source and target pins and concomitantly with the designation of source and target grid cells in which the particular source and target pins are resident. As will be discussed in greater detail below, FIG. 1g shows the result of maze routing according to the present invention, which extends the conventional maze routing technique of determining the path or route of a connection path by repeatedly expanding a wavefront of adjacent grid cells until in a final grid cell wavefront, the target grid cell is touched. Conventionally, the technique is not employed for routing with both channel and module grid cells taken together in one common scheme. In particular, as shown at step 60 in FIG. 1f, as an initial step, a first set of target pins and cells is selected. These are indicated on FIG. 1g as grid cells c8 and g3 respectively. The connection path is indicated in FIG. 1g to provide an example of a particular connection path which may be deduced according to a process as discussed below. This path follows the blocks at respective coordinates d8, d7, d6, c6, b6, b5, b4, b3, c3, c2, c1, d1, e1, e2, f2, and g2. In particular, selection of a particular wavefront grid cell may be made by comparing weighting factors including the loading and capacity of the particular wavefront grid cell with respect to prior established routing lines which may have been routed between previously selected source and target pins and cells.

This connection path can be established according to the process of the present invention by first establishing a grid cell wavefront 62 around the source cell, which may include channel grids cells. Further, a next grid cell wavefront is established 64 around the previous grid cell wavefront. Next, a determination is made 66 as to whether the grid cell just established includes the target grid cell. If the target grid cell is not included in the last established grid cell wavefront, then operation continues at control point "circle A." If the target cell is included in the last established grid cell, then no more grid cell wavefronts are constructed, and the process of plotting the particular connection route between source and target pins 68 can begin. Alternatively, the particular connection route between source and target pins can be constructed incrementally as each wavefront is completed.

FIG. 1g is a diagram of a grid cell pattern including an example routing path established in the process of maze routing according to the present invention. The particular grid array shown in FIG. 1g is based upon the global routing graph of FIG. 1c with channel and module grid cells superimposed thereover. As noted above, the example path constructed for a first set of source and target cells is indicated in "X's." The channels are indicated in a diagonal pattern, and the channel grid cells include cells e1–e9 and a5–e5. As can be seen, the maze routing technique according to the invention permits channel grid cells and module grid cells to be interspersed. This allows a single routing technique to be used for accomplishing variable channel and fixed area routing according to the same maze routing technique. This is clear from the passage of wavefronts over the boundaries of the channels between the modules.

FIG. 2 shows an example of a global routing graph which represents the surface of semiconductor chip 15 according to a design selected for implementation in accordance with the present invention. Accordingly, the global routing graph of semiconductor chip 15 includes electric circuit modules 71–75 and channel nodes 81–92. Channel nodes 81–92 are positioned at the corners of electric circuit modules 71–75 and in the channels 40 between electric circuit modules 71–75, identified by small circles, in FIG. 2. For example, in FIG. 2, electric circuit module 71 has in adjacent channels thereto, a sequence of channel nodes 82–85, 90, and 91. Four of these channel nodes 82–85 are at the corners of electric circuit module 71. However, channel node 90 is at one corner of electric circuit module 74 (the top right-hand corner thereof) as well as at one corner (the bottom right-hand corner) of electric circuit module 75. Channel nodes 81–92 are interconnected in the channels by respective segments 101–113 which surround respective electric circuit modules 71–75.

As shown in FIG. 3, selected ones of channel nodes 81–92 are surrounded by boundaried regions, herein called channel cells, respectively 120–131, having segment boundaries which are shared with the adjacent electric circuit module boundaries. For example, electric circuit module 71 shares boundaries with each of channel cells, 120–124. Similarly, electric circuit module 72 shares boundaries with channel cells 120, 121, 125, 127, and 128, inter alia. The boundaries of an electric circuit module 71–75 can be segmented, even though they need not be, and they may be unitary and undivided from case to case. Segmentation of the boundaries presents a problem in the routing process, because each boundary segment is separately data processed during the routing process. FIG. 3 shows a warp grid derived from the global routing graph of FIG. 2 based on each node and edge (i.e., boundary) of the global routing graph becoming a basic element, and each cell boundary becoming a warp grid on the boundary of each step cell row. Because there is no essential alignment between adjacent electric circuit module boundaries, warped adjacent regions are established, which is not problematic directly as a result of being warped. However, the limited width of the channel regions results in the establishment of channel regions with dimensions which may be considerably limited in comparison with the dimensions of the electric circuit modules. According to another embodiment of the present invention, the dimensions of the electric circuit modules may be considerably limited in comparison with the channels.

FIG. 4 shows another example of a global routing graph which represents the surface of semiconductor chip 15 according to a design selected for implementation in accordance with the present invention. Again, the global routing graph of semiconductor chip 15 includes electric circuit modules 71–75 and channel cells 120–131 which have segment boundaries that are shared with the adjacent electric circuit module boundaries. FIG. 4 particularly illustrates the laying down of a regular sized global routing grid including grid elements 200–210 over the warp grid arrangement shown in FIG. 3, with the effect of establishing grid cells including channel and module grid cells, based upon regularized grid size cell widths and heights which are preestablished. The module grid cells shown in FIG. 4 include module grid cells 71a–71o of electric circuit module 71 of FIG. 3. In FIG. 4, electric circuit module 72 is shown carved up into module grid cells 72a–72f. Electric circuit module 73 is shown carved up into module grid cells 73a–73f. Electric circuit module 74 is carved up into module grid cells 74a and 74b. Electric circuit module 75 remains as a single module grid cell of same numerical designation, that is 75, because of its diminutive size. The laying down of a regular sized global routing grid additionally cuts up formerly established channel cells as indicated in FIG. 3 into smaller channel grids cells as will be discussed. For example, FIG. 4 shows channel cell 120 including channel grid cells 120a and 120b. Further, channel cell 121 reestablishes itself as a single channel grid cell 121 of same size. Channel cell 122 becomes same sized channel grid cell 122. Channel cell 123 is reconstituted as channel grid cell 123. Channel cell 124 however is shown in FIG. 4 to include channel grid cell 124a and channel grid cell 124b. Channel cells 125, 126 and 127 in FIG. 4 are, respectively, the same as channel grid cells 125, 126 and 127 in FIG. 3. Channel cell 128 in FIG. 3 is split in two and becomes two channel grid cells, namely channel grid cells 128a and 128b in FIG. 4. Both channel cells 129 and 130 in FIG. 4 are the same as respective channel grid cells 129 and 130 in FIG. 3. Channel cell 131 in FIG. 3, however, now includes channel grid cells 131a and 131b in FIG. 4.

A discrepancy may exist between typical module grid and channel grid cells, because of a size difference which may exist between channel widths and module grid cells established by a selected size grid used to divide up the electric circuit modules and the channel cells. For convenience, smaller cells may be combined to form larger cells, which may result in either certain channel grid cells being larger than adjacent module grid cells, or in certain module grid cells being larger than adjacent channel grid cells. The result of this is that the boundary of a particular module grid cell may be shared with several channel grid cells, or that the boundary of a particular channel grid cell may be shared with several module grid cells, depending upon whether the particular adjacent channel grid cell or module grid cell is the relatively larger cell entity.

For example, FIG. 5 illustrates the regular size global routing grid of FIG. 4 additionally having broken-line boundary segments shown on cell boundaries which are not eligible to have routed electrical connections between two neighboring cells. The regular sized global routing grid is effective for guiding global routing on fixed sized areas over step cells, i.e., electric modules. One conventional maze routing approach performs maze routing with six neighboring cells, namely: up, down, Noah, South, East, and West. For purposes herein only four orientations are typically considered, neglecting the up and down orientations. The orientations indicated are thus the orientations of the top and bottom surfaces of the electric circuit module, as well as the edge orientations in northerly, southerly, easterly, and westerly directions.

The data processing load incurred during routing is significantly increased, when more than six cells are treated as adjacent to another cell with which electrical interconnections are sought to be effected. It accordingly is advantageous to develop a selection approach to select a limited set of preferred boundary connection segments through which connections with adjacent grid cells can be accomplished. According to one embodiment of the invention, the longest among available boundary sections is the selected boundary segment among several boundary segments. The remaining segments at a particular one of the six basic orientation directions of an electric circuit module are consequently designated as not candidates for connection under the maze routing technique. FIG. 5 shows the selected boundary segments in several instances as having broken line indications along the shared boundaries between a module grid cell and a channel grid cell. For example, channel grid cell 122 has a longer boundary segment, i.e., boundary segment 303 or shared border with module grid cell 71 g than does channel grid cell 121 which abuts module grid cell 71g with boundary segment 302. In general, circuit connections across a longer boundary segment are preferred over a narrower channel grid cell. Accordingly, at least some of the shorter boundary segments are considered ineligible for establishment of electrical connections thereacross. Thus, in the case of module grid cell 71j and channel grid cells 123 and 124a, the respective shared boundary segments 304 and 305 are respectively non-eligible and eligible for routing connections therethrough. Similarly, in the case of module grid cell 73d and channel grid cells 130 and 131a, the respective shared boundary segments 307 and 306 are respectively eligible and non-eligible for routing connections therethrough.

FIG. 6 illustrates a regular sized global routing grid version similar to that shown in FIG. 5, but having some of the modules, that is electric circuit modules 73, 74, and 75 of FIG. 3 shifted downward to create channels of greater width and channel grid cells greater than some module grid cells. As a result, channel grid cells are created such as channel grid cell 321 which is larger at least in one dimension than adjacent module grid cells 71g and 71j, for example. According to one embodiment of the invention, certain boundary segments on the perimeter of channel grid cell 321, for example, may be deselected as candidate boundary segments for routing purposes between particular grid cells. One embodiment of the invention includes the process of selecting or deselecting particular boundary sections on an orientation basis. According to this embodiment, comparing boundary segments 406 and 407 of channel grid cell 321 for an East orientation, only one of the boundary segments, that is, in this case, boundary segment 406 is the successful boundary segment for permitting routing therethrough. The same general principles permit selection to be conducted as to boundary segments 407 and 408 of module grid cell 71j.

In summary, the embodiments of the present invention is directed toward use of a grid based global routing relying upon congestion cost on over-the-step cell areas. In the channels, global routing is based upon chip dye size cost. The grid routing embodiments of the invention thus provide a way to combine the capabilities of area-based global routers with those of channel-based global routers by employing grid router techniques in channel regions of the semiconductor chip design.

What is claimed is:

1. A computer-implemented method for interconnecting a plurality of adjacent electric circuit modules and channel grid cells having common boundary segments, where the modules each have a predetermined number of orientations and are separated by channels of variable widths, and each module has electric connection pins at module locations for interconnection according to a predetermined circuit scheme; the method comprising:

dividing the electric circuit modules into module grid cells of predetermined dimensions and having the same number of orientations as said electric circuit modules, reducing said channels into variable sized channel grid cells, each of which shares common boundary segments with adjacent module grid cells and has the same number of general orientations as said electric circuit modules, identifying common boundary segments of said channel and module grid cells, through which circuit connections are routable to electrically connect the connection pins of said electric circuit modules in accordance with a predetermined circuit scheme, and selecting for a particular module grid cell boundary, a reduced number of common boundary segments through which routing of circuit connections is permitted.

2. The method according to claim 1, including selecting a single boundary segment for routing between an adjacent electric circuit module and a channel grid cell.

3. The method according to claim 1, including making no circuit connections for a selected orientation of a particular channel grid cell.

4. The method according to claim 1, including limiting the number of boundary segments for a module grid cell to no more than four.

5. The method according to claim 1, including limiting the number of boundary segments for a module grid cell to no more than three.

6. A computer-implemented method for interconnecting a plurality of adjacent electric circuit modules and channel grid cells having common boundary segments, where the modules have predetermined pluralities of electric connection pins distributed at predetermined locations in a three-dimensional module and have prespecified electrical connections therebetween, and the electric circuit modules are separated by channels of at least a single predetermined width; said method comprising:

constructing a representation of a plurality of electric circuit modules each containing a plurality of pins representing electric terminals of electrical circuitry within the electric circuit module associated with the particular pin, dividing the electric circuit modules into module grid cells of predetermined dimensions, dividing the channels between the electric circuit modules into variable sized channel grid cells each of which shares common boundary segments with adjacent ones of said module grid cells, identifying common boundary segments through which circuit connections can be routed for connection pins having prespecified electrical connections therebetween, so that no more than a single boundary segment on one side of a module grid cell is permitted to serve as a connection path to connection pins of another grid cell, selecting first and second electric connection pins for routing an electrical connection path therebetween, selecting one of said first and second electric connection pins as the source pin and the other as the target pin and identifying corresponding first and second module grid cells with which the respective target and source pins are associated at target and source module grid cells, identifying a first grid cell wavefront of first neighboring grid cells adjacent said source grid cell, establishing connection cost values indicative of the burden of making a connection between source and target pins through said first grid cell wavefront at particular ones of the grid cells in said first grid cell wavefront, identifying successive grid cell wavefronts of grid cells immediately adjacent the immediately previously established grid cell wave from, associating connection cost values with the grid cells in the successive grid cell wavefronts and said first grid cell wavefront indicative of the burdens of establishing a connection between source and target pins through particular ones of the grid cells of said grid cell wavefront, and designating a connection route between said source and target pins and through selected grid cells of said grid cell wavefronts in view of said grid cell cost values.

7. A computer implemented method for routing electrical connections in a semiconductor chip, including:

defining first and second dimensions of respective selected first and second adjacent electric circuit modules;

setting a first variable set of relative distance relationships between said first and second adjacent electric circuit modules;

establishing a variably dimensionable channel grid cell having common boundaries with each of said first and second electric circuit modules; and defining an electrical connection between said first and second electric circuit modules.

8. The computer implemented method of claim 7 wherein said variably dimensionable channel grid cell is trapezoidal.

9. The computer implemented method of claim 7 including defining grid cells of predetermined dimensions in said first and second adjacent electric circuit modules.

10. The computer implemented method of claim 7 including modifying a distance relationship between said first and second adjacent electric circuit modules.

11. The computer implemented method of claim 7 including defining a global routing graph.

12. The computer implemented method of claim 11 including defining a node at a corner of at least one of said first and second electric circuit modules.

13. The computer implemented method of claim 11 including establishing a variably dimensionable channel grid cell at said node.

14. A computer implemented method for routing electrical connections between selected locations in adjacent fixed size electric circuit modules which can be repositioned during routing relative to each other to vary the channel with separating the adjacent electric circuit modules, including:

defining nodes at corners of each fixed size electric circuit module;

establishing a variable sized channel cell tangent to each of the adjacent fixed size electric circuit modules; and routing at least a single electrical connection between said adjacent fixed size electric circuit modules.

15. The computer implemented method of claim 14 including establishing a variable sized channel cell sharing borders with each of said adjacent fixed size electric circuit modules.

* * * * *